United States Patent
Gwon et al.

(10) Patent No.: US 10,305,519 B2
(45) Date of Patent: May 28, 2019

(54) POWER SUPPLY APPARATUS FOR POWER AMPLIFIER

(71) Applicants: Samsung Electro-Mechanics Co., Ltd., Suwon-si (KR); Korea Advanced Institute of Science and Technology, Daejeon (KR)

(72) Inventors: Hui Dong Gwon, Daejeon (KR); Gyu Hyeong Cho, Daejeon (KR); Jeong Hoon Kim, Suwon-si (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/147,418

(22) Filed: May 5, 2016

(65) Prior Publication Data
US 2017/0019133 A1    Jan. 19, 2017

(30) Foreign Application Priority Data

Jul. 14, 2015    (KR) .......................... 10-2015-0100009

(51) Int. Cl.
*H01Q 11/12*    (2006.01)
*H04B 1/04*    (2006.01)
(Continued)

(52) U.S. Cl.
CPC ............ *H04B 1/0475* (2013.01); *H02M 1/08* (2013.01); *H02M 3/158* (2013.01);
(Continued)

(58) Field of Classification Search
CPC .. H03F 3/245; H03F 1/0227; H03F 2200/102; H03F 2200/105
(Continued)

(56) References Cited

U.S. PATENT DOCUMENTS 5,774,797 A  *  6/1998  Kawano ................. H03G 3/007
                                                            455/117
6,421,533 B1 *  7/2002  Greverie .............. H03G 3/3047
                                                            330/129
(Continued)

FOREIGN PATENT DOCUMENTS

CN        101494466 A       7/2009
CN        104113285 A      10/2014
(Continued)

OTHER PUBLICATIONS

Chinese Office Action dated Jun. 29, 2018 in Corresponding Chinese Patent Application No. 201610388510.X ( 12 pages in English, 10 pages in Chinese).

*Primary Examiner* — Edward F Urban
*Assistant Examiner* — Rui M Hu
(74) *Attorney, Agent, or Firm* — NSIP Law

(57) ABSTRACT

A power supply apparatus for a power amplifier includes a converter configured to convert input power into driving power for the power amplifier, a detector configured to transfer the driving power from the converter to the power amplifier, including an inductor formed on a detection path of the driving power, and configured to detect power information regarding the driving power to generate a detected signal, and a controller configured to control power conversion of the converter based on an envelope signal of a signal input to the power amplifier and the detected signal.

17 Claims, 12 Drawing Sheets

(51) Int. Cl.
*H03F 1/02* (2006.01)
*H03F 3/19* (2006.01)
*H02M 1/08* (2006.01)
*H02M 3/158* (2006.01)
*H03F 3/24* (2006.01)
*H02M 1/00* (2006.01)

(52) U.S. Cl.
CPC ............ *H03F 1/0211* (2013.01); *H03F 3/19* (2013.01); *H03F 3/245* (2013.01); *H02M 3/1584* (2013.01); *H02M 2001/0025* (2013.01); *H03F 2200/102* (2013.01); *H03F 2200/105* (2013.01); *H03F 2200/451* (2013.01); *H04B 2001/0416* (2013.01)

(58) Field of Classification Search
USPC .................................... 455/126, 127.1–127.5
See application file for complete search history.

(56) References Cited

U.S. PATENT DOCUMENTS

| | | | | |
|---|---|---|---|---|
| 6,701,138 | B2* | 3/2004 | Epperson | H03F 1/0211 330/133 |
| 7,315,152 | B1* | 1/2008 | Epperson | H03F 1/0205 323/271 |
| 7,340,235 | B1* | 3/2008 | Madsen | H03F 1/0205 330/254 |
| 7,466,965 | B2* | 12/2008 | Tanabe | H04L 27/361 348/E5.093 |
| 7,482,873 | B2* | 1/2009 | Van Bezooijen | H03F 1/0238 330/278 |
| 7,702,300 | B1* | 4/2010 | McCune | H03C 5/00 455/108 |
| 7,977,947 | B1* | 7/2011 | Jones | G01R 21/07 324/522 |
| 8,019,293 | B2* | 9/2011 | Dagher | H04W 52/52 455/127.1 |
| 8,344,806 | B1* | 1/2013 | Franck | H03F 3/195 330/285 |
| 8,509,713 | B2* | 8/2013 | Kenington | H03F 3/68 455/126 |
| 8,594,589 | B2* | 11/2013 | Yamanouchi | H03F 1/0244 375/295 |
| 8,620,240 | B2* | 12/2013 | Yamanouchi | H03F 1/0227 375/297 |
| 8,633,766 | B2* | 1/2014 | Khlat | H02M 3/07 323/222 |
| 8,897,724 | B2* | 11/2014 | Hou | H03F 1/025 455/127.1 |
| 8,989,682 | B2* | 3/2015 | Ripley | H03F 1/0227 455/127.1 |
| 9,031,520 | B2* | 5/2015 | McCallister | H04B 1/0475 455/114.3 |
| 2002/0183019 | A1* | 12/2002 | Dent | H03F 1/0222 455/108 |
| 2005/0032488 | A1* | 2/2005 | Pehlke | H03C 1/06 455/127.1 |
| 2005/0208907 | A1* | 9/2005 | Yamazaki | H03F 1/34 455/126 |
| 2007/0243838 | A1* | 10/2007 | Lang | H03C 1/62 455/127.1 |
| 2007/0249304 | A1* | 10/2007 | Snelgrove | H03F 1/0205 455/127.2 |
| 2009/0191923 | A1 | 7/2009 | Fudaba et al. | |
| 2009/0218995 | A1* | 9/2009 | Ahn | H03F 1/0227 323/235 |
| 2010/0120384 | A1* | 5/2010 | Pennec | H03F 1/0261 455/126 |
| 2011/0074384 | A1* | 3/2011 | Labib | G01R 19/0092 324/76.11 |
| 2013/0194037 | A1* | 8/2013 | Takahashi | H03F 1/32 330/3 |
| 2013/0222062 | A1 | 8/2013 | Park et al. | |
| 2013/0271221 | A1* | 10/2013 | Levesque | H03F 3/193 330/294 |
| 2014/0241462 | A1 | 8/2014 | Bellaouar et al. | |
| 2016/0088679 | A1* | 3/2016 | Khlat | H04W 52/0229 455/127.1 |
| 2016/0099687 | A1* | 4/2016 | Khlat | H03F 1/0227 455/127.3 |

FOREIGN PATENT DOCUMENTS

| | | |
|---|---|---|
| CN | 105210289 A | 12/2015 |
| KR | 10-1249016 B1 | 4/2013 |
| KR | 10-2013-0097502 A | 9/2013 |
| WO | WO 2014/078103 A1 | 5/2014 |

* cited by examiner

POWER SUPPLY APPARATUS FOR POWER AMPLIFIER

CROSS-REFERENCE TO RELATED APPLICATION(S)

This application claims the benefit under 35 U.S.C. § 119(a) of Korean Patent Application No. 10-2015-0100009 filed on Jul. 14, 2015, in the Korean Intellectual Property Office, the entire disclosure of which is incorporated herein by reference for all purposes.

BACKGROUND

1. Field

The following description relates to a power supply apparatus supplying power to a power amplifier used for wireless communications.

2. Description of Related Art

Wireless communications schemes allowing large amounts of information to be transmitted have recently become more commonplace. The characteristics of wireless transmission signals currently used in wireless communications and intended for use in the future have a wide band and a high peak to average power ratio.

Accordingly, signal bandwidths are increased. In order to improve overall efficiency of systems in such environments, the consumption of direct current power by power amplifiers is beneficially reduced.

However, when power amplifiers are generally designed, there exists a disadvantage in that the power amplifier is reduced from a maximum power point by several dB, in order to secure linearity. This results in the reduction of overall efficiency of the system because efficiency is decreased at lower power settings.

Previous attempts to address such issues, such as by an envelope tracking method may be problematic, in that a signal bandwidth which is processed is not significantly wide, and such a circuit and a configuration are relatively complex, even if wide bandwidth signals are processed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a power supply apparatus includes a converter configured to convert input power into driving power, a detector configured to transfer the driving power from the converter to a power amplifier, and including an inductor formed on a detection path of the driving power, and configured to detect power information of the driving power to generate a detected signal; and a controller configured to control power conversion of the converter based on an envelope signal of a signal input to the power amplifier and the detected signal.

The detector may include a first detection path configured to detect voltage information of the driving power through a resistor connected to an input terminal of the inductor; and a second detection path configured to detect current information of the inductor through a capacitor connected to an output terminal of the inductor.

The detector may be configured to divide a first signal through the first detection path and a second signal through the second detection path, and feed back the divided detected signal to the controller.

The controller may include a first comparator configured to compare the detected signal with the envelope signal, and a second comparator configured to compare a comparison result of the first comparator with a reference signal to provide a control signal to the converter.

The converter may include a multi-level converter.

The converter may include a three-level converter.

The controller may include a first comparison block configured to compare the envelope signal with the detected signal and compare a comparison result with a reference signal to provide a first control signal controlling power conversion of the converter; and a second comparison block configured to compare the envelope signal with the detected signal and compare a comparison result with a signal obtained by phase-shifting the reference signal by 180° to provide a second control signal controlling the power conversion of the converter.

According to another general aspect, a power supply apparatus includes power modules configured to supply driving power, wherein each of the power modules includes: a converter configured to convert input power into a driving power; a detector configured to transfer the driving power from the converter to a power amplifier, and including an inductor formed on a detection path of the driving power, configured to detect information of the driving power to generate a detected signal; and a controller configured to control power conversion of the converter based on an envelope signal of a signal input to the power amplifier and the detected signal.

The detector may include a first detection path configured to detect voltage information of the driving power through a resistor connected to an input terminal of the inductor; and a second detection path configured to detect current information of the inductor through a capacitor connected to an output terminal of the inductor and commonly connected to the plurality of power modules.

The detector may be further configured to divide a first signal through the first detection path and a second signal through the second detection path, and feedback the divided detected signal to the controller.

The controller may include a first comparator configured to compare the detected signal with the envelope signal; and a second comparator configured to compare a comparison result of the first comparator with a reference signal to provide a control signal to the converter.

The converter may include a multi-level converter.

The converter may include a three-level converter.

The controller may include a first comparison block configured to compare the envelope signal with the detected signal and compare a comparison result thereof with a reference signal to provide a first control signal controlling power conversion of the converter; and a second comparison block configured to compare the envelope signal with the detected signal and compare a comparison result thereof with a signal obtained by phase-shifting the reference signal by 180° to provide a second control signal controlling the power conversion of the converter, wherein a phase of the reference signal input to the controller of each of the plurality of power modules and a phase of the signal obtained by phase-shifting the reference signal are different from each other.

According to another general aspect, a method of controlling a power supply, includes actuating a power converter to convert an input power into a driving power, monitoring a detector to identify an operational characteristic of the driving power to generate a detected signal, and, executing a controller to regulate power conversion of the converter based on the detected signal and a signal input to a power amplifier.

The method may further include generating an envelope according to the signal input to the power amplifier, wherein the power conversion is adaptively regulated based on the envelope signal and the detected signal.

The monitoring of the detector to identify an operational characteristic of the driving power may include identifying a voltage and a current characteristic by respectively operating a voltage divider and an inductor to responsively generate the detected signal.

The method may further include inserting a high frequency zero signal, in a compensatory manner for a complex pole, into the detected signal to increase a bandwidth of the signal.

The method may further include collectively actuating power converters coupled to a shared comparator, and actuating the shared comparator to compare the respective driving powers converted by each of the corresponding power converters to adapt the conversion thereof to provide the driving power in substantially equivalent manner amongst the power converters.

The method may further include energizing the power amplifier with the driving power, actuating the power amplifier to amplify the signal input thereto to generate an amplified signal, and, transmitting the amplified signal wirelessly to a remote terminal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
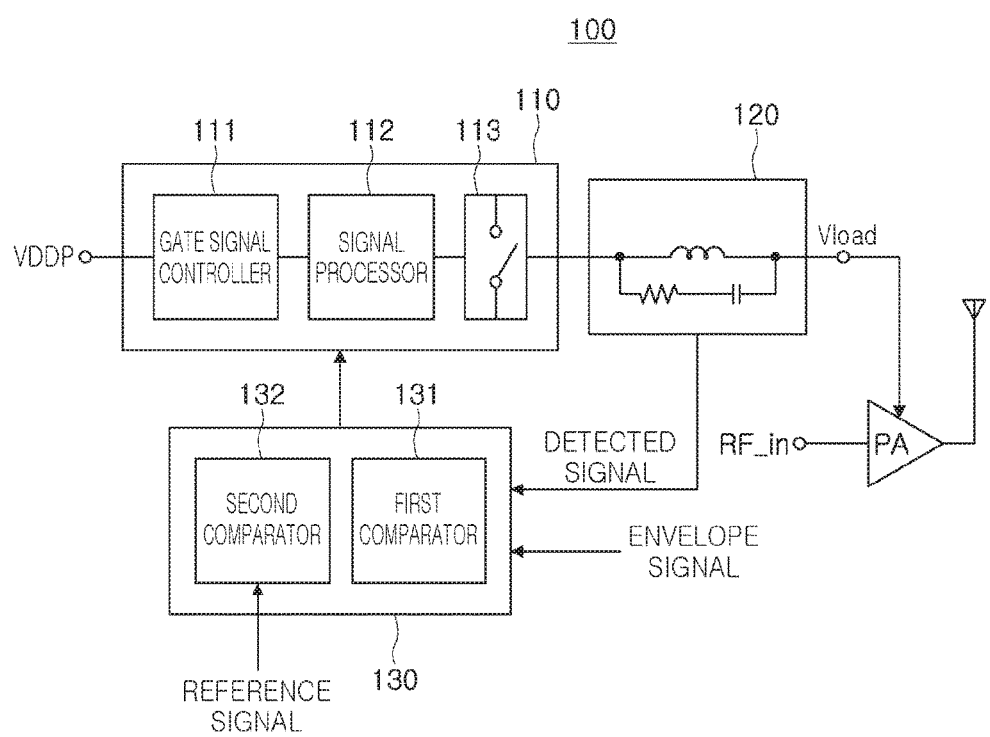
FIG. 1 is a schematic block diagram of a power supply apparatus for a power amplifier according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it may be directly "on," "connected to," or "coupled to" the other element, or other elements intervening therebetween may be present. In contrast, when an element is referred to as being "directly on," "directly connected to," or "directly coupled to" another element, there are no elements or layers intervening therebetween. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" than the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

In the drawings, for example, due to manufacturing techniques and/or tolerances, modifications of the shape shown may be encountered. For this reason, embodiments should not be construed as being limited to the particular shapes of regions shown herein, but should be understood to include, for example, changes in shape resulting from manufacturing. The following embodiments may also be constituted by one or a combination thereof.

FIG. 1 is a schematic block diagram of a power supply apparatus for a power amplifier according to an embodiment.

Referring to FIG. 1, a power supply apparatus 100 for a power amplifier according to an embodiment includes a converter 110, a detector 120, and a controller 130.

The converter 110 converts input power VDDP into driving power Vload of a power amplifier PA and supplies the converted driving power Vload to the power amplifier PA.

The converter 110 includes a gate signal controller 111, a signal processor 112, and a switch 113.

The gate signal controller 111 generates a gate signal according to a control signal from the controller 130, and the signal processor 112 drives switch 113 by appropriately performing signal processing on the gate signal generated by the gate signal controller 111. The switch 113 includes at least one switch element.

The detector 120 transfers the driving power Vload, of the power amplifier PA, to the power amplifier PA and detects voltage information regarding the driving power Vload. Further, the detector 120 includes an inductor on a transfer path by which the driving power Vload is transferred and detects current information regarding the driving power Vload flowing in the inductor.

The controller 130 provides a control signal controlling a power conversion operation of the converter 110 to the converter 110, based on a detected signal output by the detector 120 and an envelope signal of an RF signal RF_in input to the power amplifier PA.

The controller 130 includes a first comparator 131 and a second comparator 132.

The first comparator 131 compares the envelope signal with the detected signal and outputs the comparison result. A current level of an output signal of the first comparator 131 is responsively increased or decreased depending on a difference in levels between the envelope signal and the detected signal.

The second comparator 132 compares the output signal of the first comparator 131 with a reference signal to generate and output the control signal.

Figure 2:
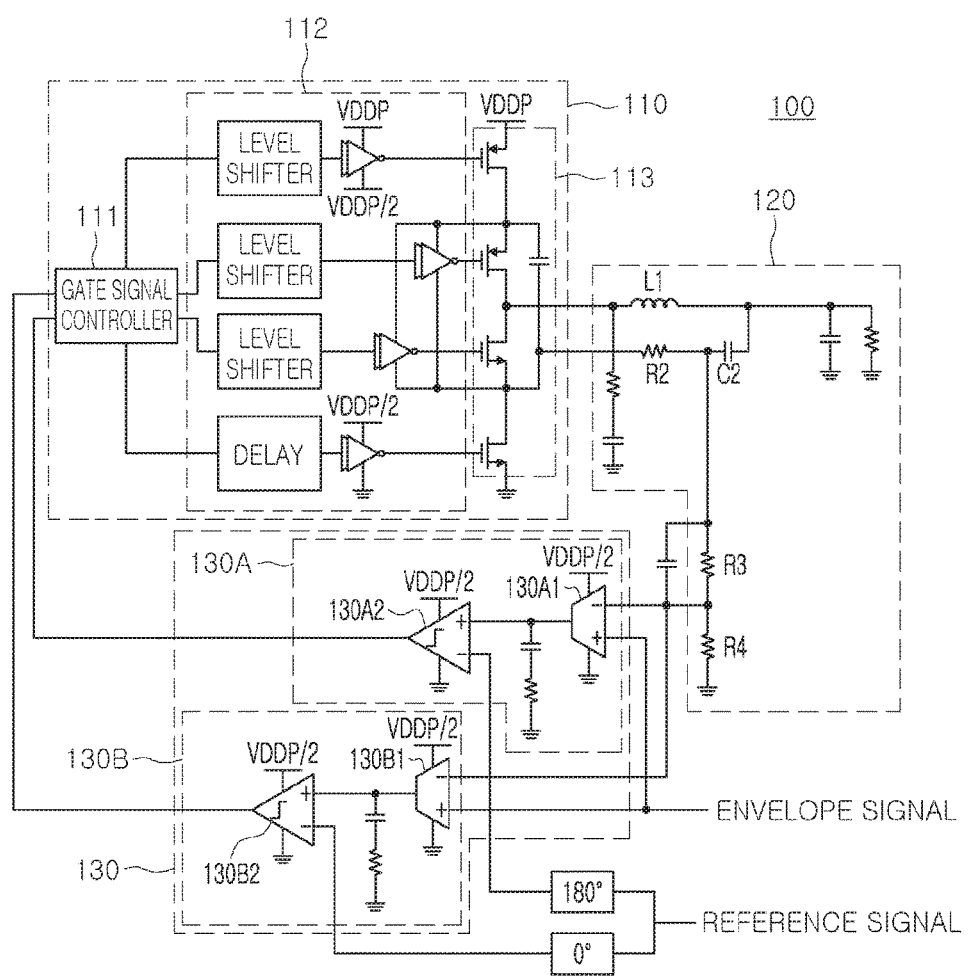
FIG. 2 is a circuit diagram illustrating the power supply apparatus for a power amplifier according to an embodiment illustrated in FIG. 1.

FIG. 2 is a circuit diagram illustrating the power supply apparatus for a power amplifier according to an embodiment illustrated in FIG. 1.

Referring to FIG. 2, the gate signal controller 111 generates the gate signal according to the control signal from the controller 130. Signal processor 112 drives the switch 113 by performing the signal processing for the gate signal generated by the gate signal controller 111.

The switch 113 includes at least one switch and, in various embodiments includes a plurality of switches connected between a driving power terminal VDDP and a ground in series. For example, the switch 113 includes four switches connected between the driving power terminal VDDP and the ground in series, and the converter 110 is operated as a three-level converter.

In order to operate the four switches, respectively, the signal processor 112 includes a plurality of level shifters and a delay to shift or introduce a delay to a level of the gate signal from the gate signal controller 111. The shifted or delayed level of the gate signal is amplified to an appropriate level capable of driving the switch by a plurality of amplifiers.

The above-mentioned three-level converter has a low actual switching frequency, but is operable at a high effective switching frequency.

The detector 120 detects voltage information regarding the driving power Vload, and includes the inductor on the transfer path by which the driving power Vload is transferred to detect the current information regarding the driving power Vload flowing in the inductor.

The detector 120 includes an inductor L1 formed on the path on which the driving power Vload is transferred, and a resistor R2 and a capacitor C2 connected to the inductor L1 in parallel and connected to each other in series. Further, the detector 120 includes divided resistors R3 and R4 dividing the detected voltage.

The detector 120 feeds back the voltage information regarding the driving power Vload and the current information regarding the inductor L1 to the controller 130 and inserts a high frequency zero to compensate for a complex pole, thereby increasing a bandwidth of a signal.

A description thereof will be provided below with reference to FIGS. 5A through 5D and 6A through 6C.

In an example in which the switch 113 of the converter 110 is operated as the three-level converter having the four switches connected to each other in series, the controller 130 includes a first comparison block 130A and a second comparison block 130B (as seen in FIG. 2).

The first and second comparison blocks 130A and 130B respectively include first and second comparators 130A1, 130A2, 130B1, and 130B2, and the first comparators 130A1 and 130B1 compare the envelope signal with the detected signal and output the comparison result. Current levels of output signals of the first comparators 130A1 and 130B1 are increased or decreased depending on a difference in levels between the envelope signal and the detected signal.

The second comparators 130A2 and 130B2 compare the output signals of the first comparators 130A and 130B1 with a reference signal and output the control signal. A reference signal input to the second comparator 130A2 of the first comparison block 130A and a reference signal input to the second comparator 130B2 of the second comparison block 130B have a phase difference of about 180°.

In an embodiment, the reference signal is a triangular wave signal, though any suitable signal waveform may be employed such as a square or sine wave.

The second comparators 130A2 and 130B2 provide the control signal for duty cycle so that a switching on occurs during a time corresponding to a case in which a level of the reference signal is higher than levels of the output signals of the first comparators 130A1 and 130B1.

Figure 3:
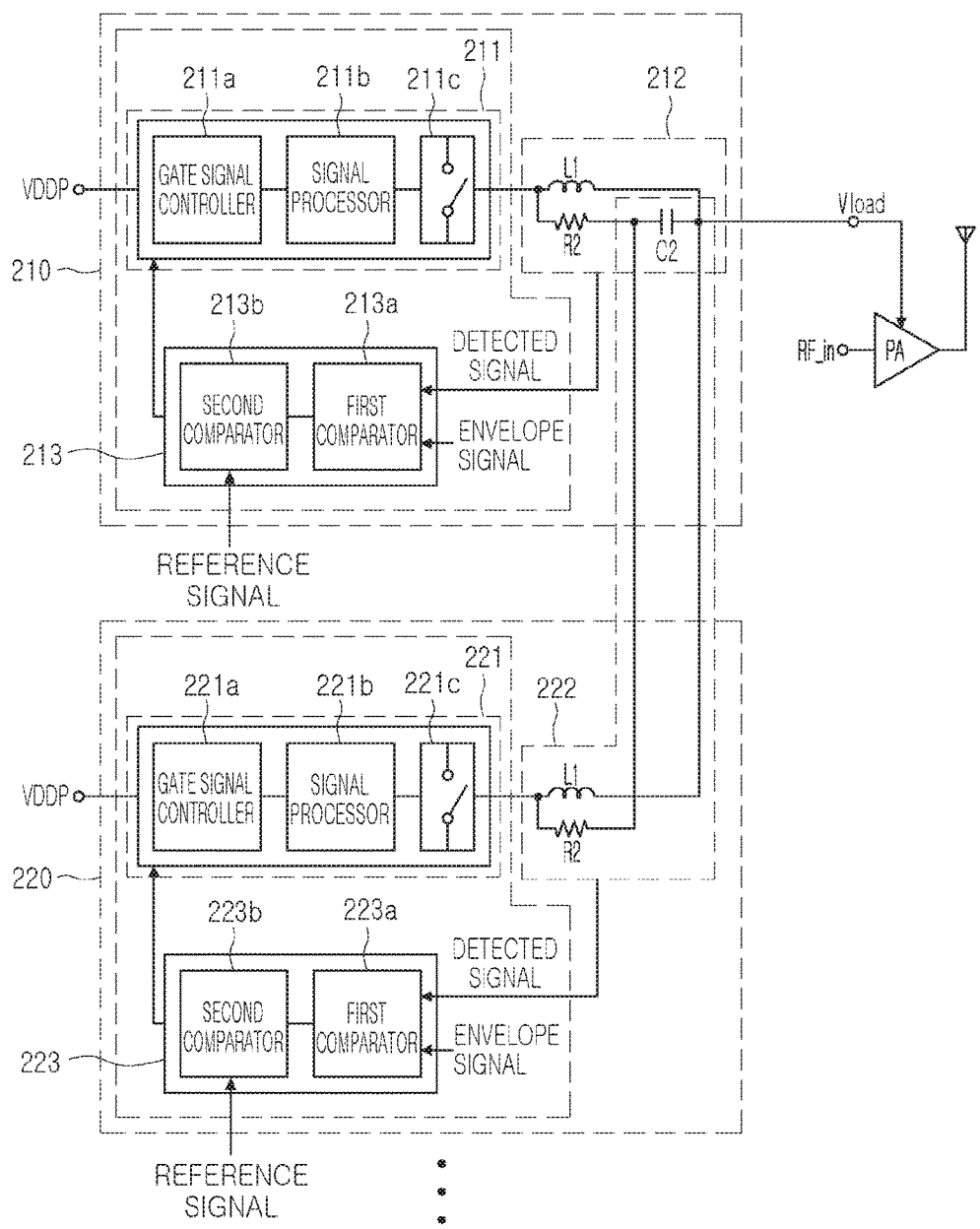
FIG. 3 is a schematic block diagram of a power supply apparatus for a power amplifier according to another embodiment.
Figure 4:
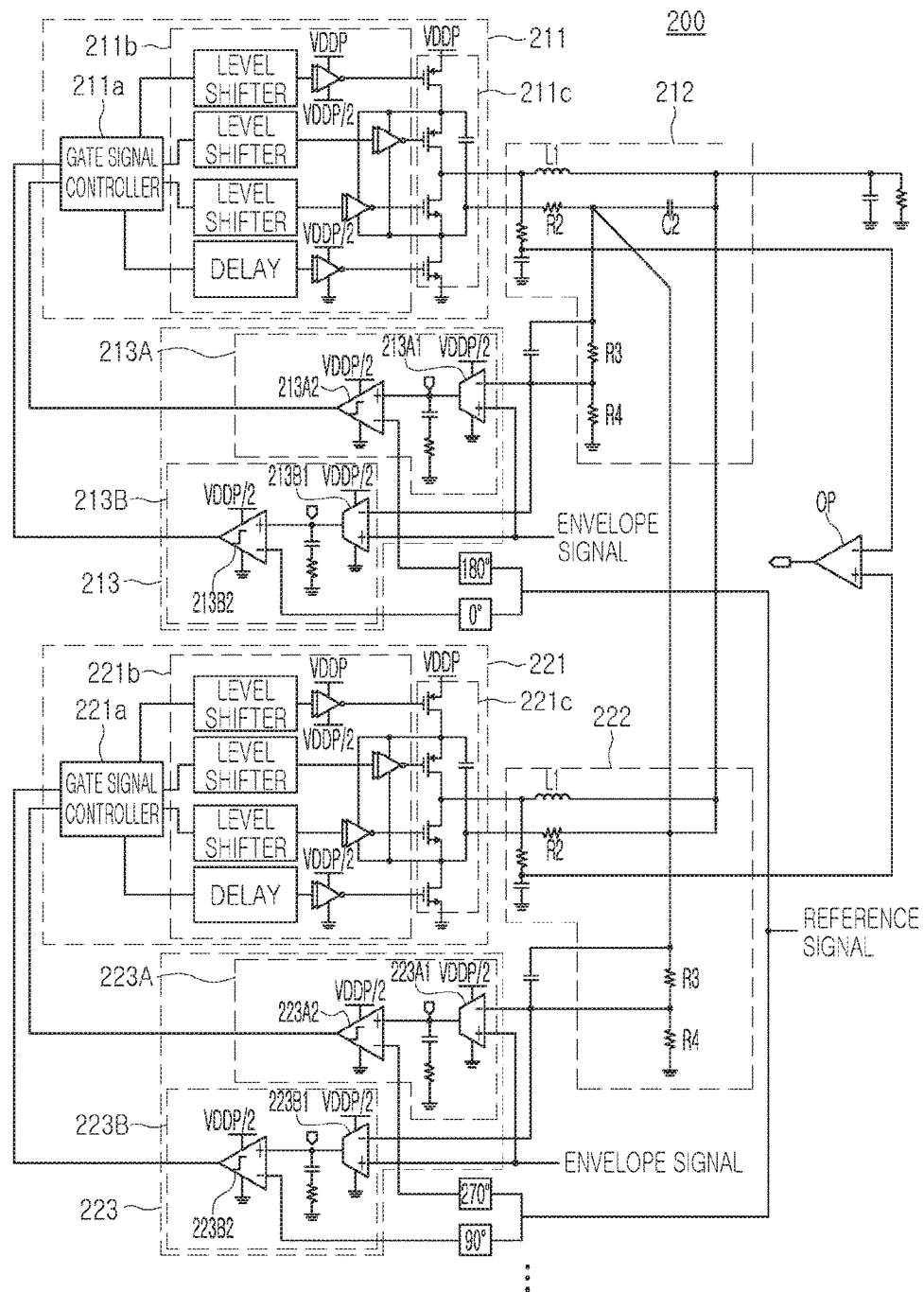
FIG. 4 is a circuit diagram illustrating the power supply apparatus for a power amplifier according to another embodiment illustrated in FIG. 3.

FIG. 3 is a schematic block diagram of a power supply apparatus for a power amplifier according to another embodiment and FIG. 4 is a circuit diagram illustrating the power supply apparatus for a power amplifier according to another embodiment illustrated in FIG. 3.

According to a power supply apparatus 200 for a power amplifier according to another embodiment, the power supply apparatus 200 for a power amplifier includes a plurality of power modules 210 and 220.

Power signals output by the plurality of power modules 210 and 220 are supplied to the power amplifier PA as the driving power.

A configuration of each of the plurality of power modules 210 and 220 described above may be the same, or similar, as the configuration of the power supply apparatus 100 illustrated in FIGS. 1 and 2, and accordingly, for clarity and conciseness, will not be repeated here. Configurations of detectors 212 and 222 and controllers 213 and 223 may be slightly different from the configuration illustrated in FIGS. 1 and 2.

A portion different from the configuration of the power supply apparatus 100 illustrated in FIGS. 1 and 2, among the configurations of the detectors 212 and 222 and the controllers 213 and 223 described above, will be described in more detail below.

As an example, the detectors 212 and 222 commonly use a capacitor C2.

The detector 212 includes an inductor L1 and a resistor R2. A front-end of the inductor L1 and a front-end of the resistor R2 are electrically connected to each other. A rear-end of the inductor L1 is electrically connected to a rear-end of the capacitor C2, and a rear-end of the resistor R2 is electrically connected to a front-end of the capacitor C2.

Similarly, the detector 222 includes an inductor L1 and a resistor R2, a front-end of the inductor L1 and a front-end of the resistor R2 are electrically connected to each other. A rear-end of the inductor L1 is electrically connected to a rear-end of the capacitor C2, and a rear-end of the resistor R2 is electrically connected to a front-end of the capacitor C2.

The above-mentioned configuration is slightly different from the configuration of the power supply apparatus 100 illustrated in FIGS. 1 and 2, but a technical effect is similar, in which the voltage information regarding the driving power Vload and the current information regarding the inductor L1 are fed back to the controller 130 and a high frequency zero is inserted to compensate for a complex pole, thereby increasing a bandwidth of a signal.

The power supply apparatus 200 for a power amplifier according to another embodiment includes a comparator OP, and each of the controllers 231 and 232 receive a signal from the comparator OP.

The comparator OP receives outputs of the respective converters 211 and 221 and compares the received outputs with each other to add, or subtract, a current to or from output signals of first comparators 231A1, 231B1, 232A1, and 232B1 of the first and second comparison blocks 231A, 231B, 232A, and 232B of the respective controllers 231 and 232, thereby configuring the power module to equivalently output power.

Second comparators 231A2, 231B2, 232A2, and 232B2 of the first and second comparison blocks 231A, 231B, 232A, and 232B of the respective controllers 231 and 232 have reference signals applied thereto. The reference signals may have different phases.

For example, the reference signals applied to the second comparators 231A2, 231B2, 232A2, and 232B2 of the first and second comparison blocks 231A, 231B, 232A, and 232B of the respective controllers 231 and 232 have a phase difference of, for instance, 0°, 90°, 180°, and 270°.

FIGS. 5A through 5D are equivalent circuit diagrams illustrating an operation of the power supply apparatus for a power amplifier according to an embodiment. FIGS. 6A through 6C are graphs illustrating an increase in a bandwidth of the power supply apparatus for a power amplifier according to an embodiment.

Figure 5A:
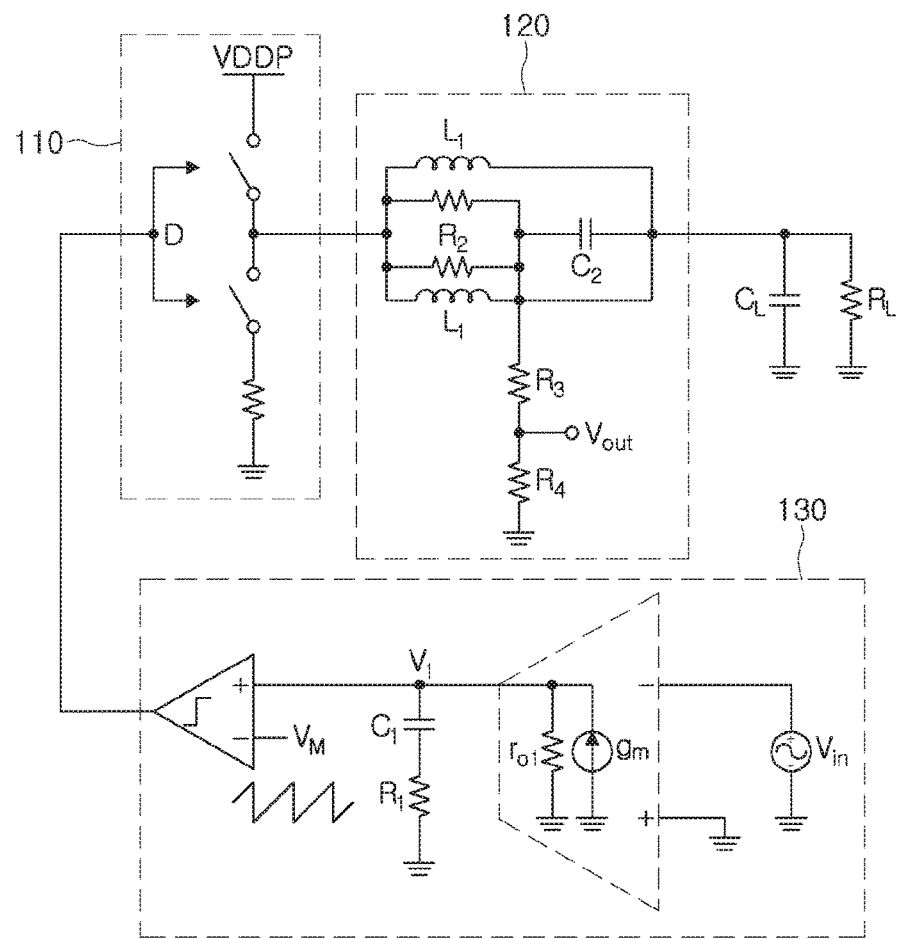
FIGS. 5A through 5D are equivalent circuit diagrams illustrating an operation of the power supply apparatus for a power amplifier according to an embodiment.
Figure 5B:
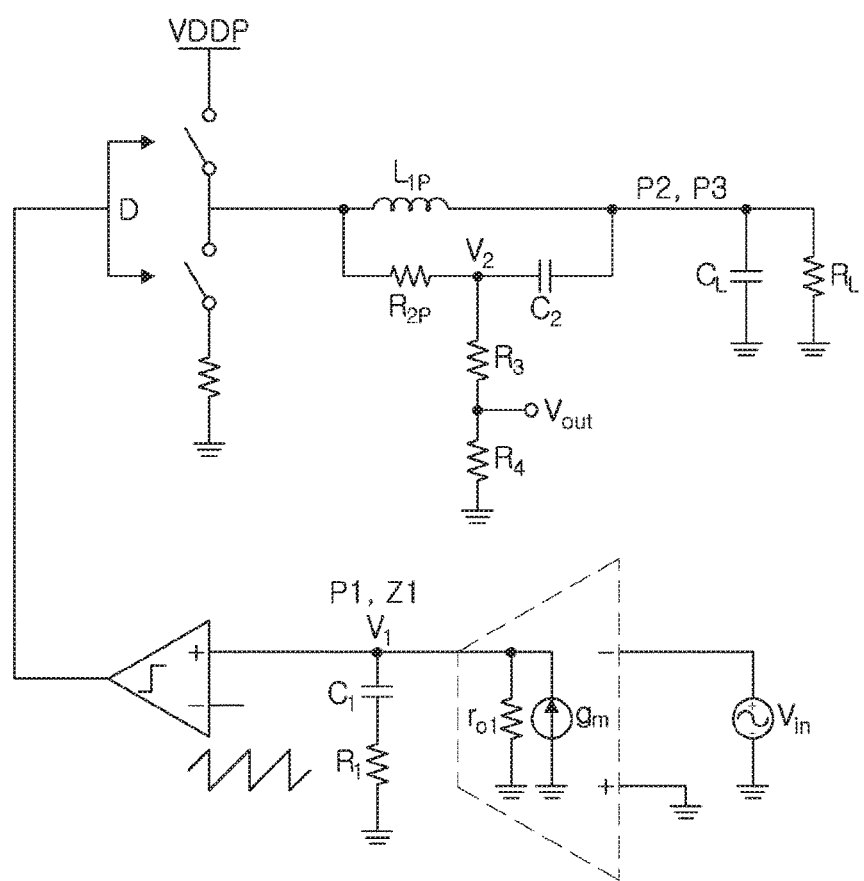
Figure 6A:
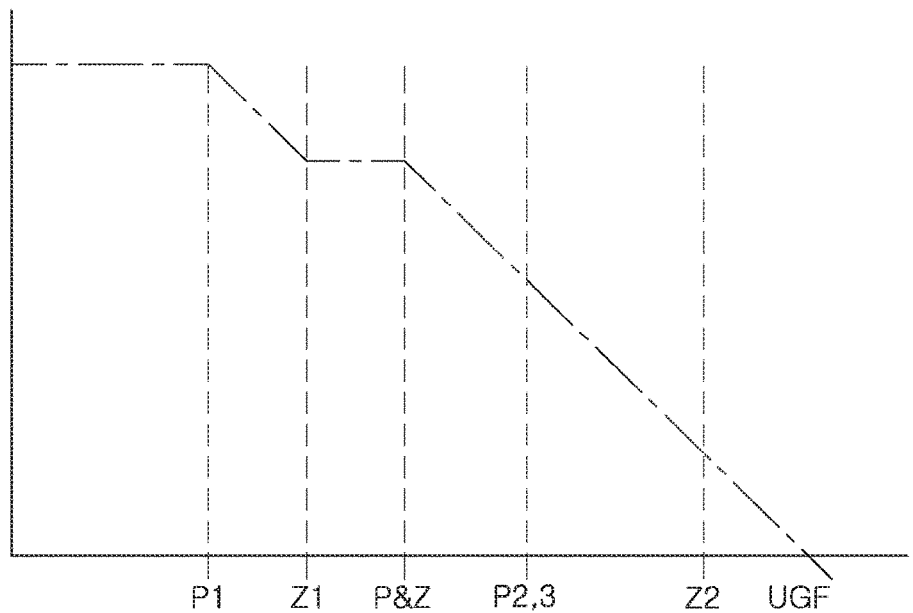
FIGS. 6A through 6C are graphs illustrating an increase in a bandwidth of the power supply apparatus for a power amplifier according to an embodiment.
Figure 6B:
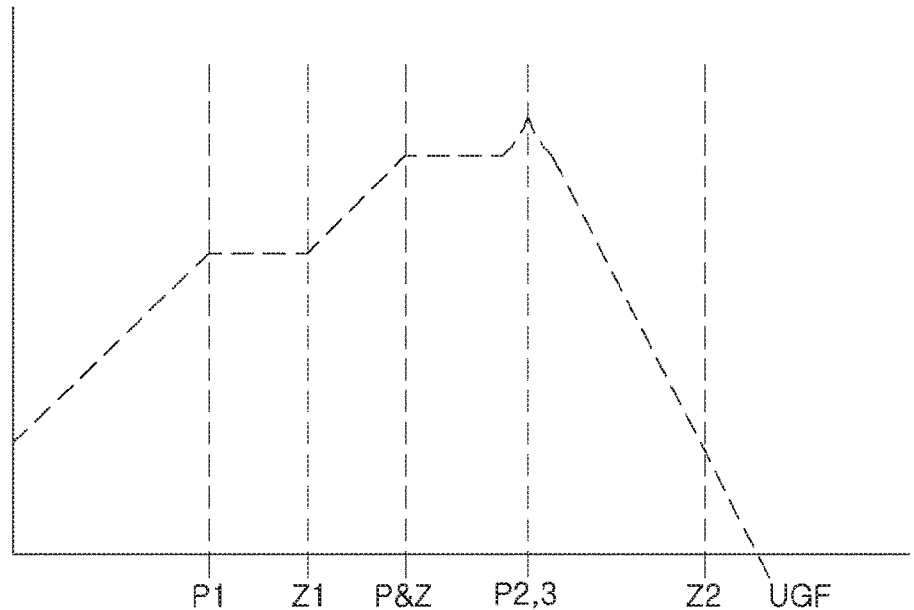
Figure 6C:
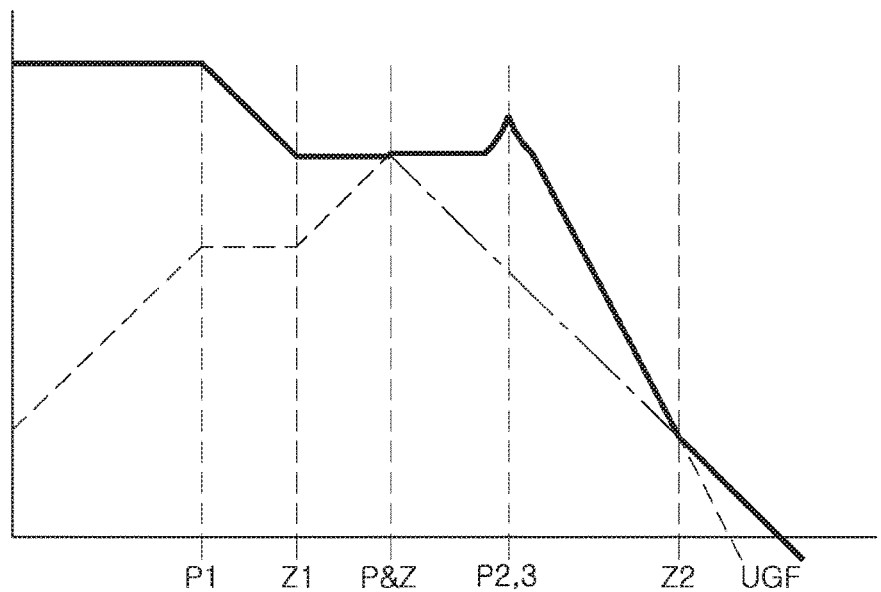

FIG. 5A illustrates a plurality of power modules of the power supply apparatus 200 corresponding to the power amplifier illustrated in FIG. 4 in one example equivalent circuit diagram. The detector 220 is illustrated as a resistor R2P, dividing resistors R3 and R4, an inductor L1P and a capacitor C2 of a single equivalent circuit as illustrated in FIG. 5B. The power supply apparatus 100 for a power amplifier, illustrated in FIG. 2, is illustrated in the equivalent circuit diagram of FIG. 5B.

The equivalent circuit of the detector of FIG. 5B is described below. The detector has two detection paths.

A first detection path includes the resistor R2P and a connection point between dividing resistors R3 and R4, and a second detection path includes the inductor L1P, the capacitor C2, and the connection point between the dividing resistors R3 and R4.

The first detection path detects voltage information regarding driving power, and the second detection path detects current information regarding the inductor DP.

Figure 5C:
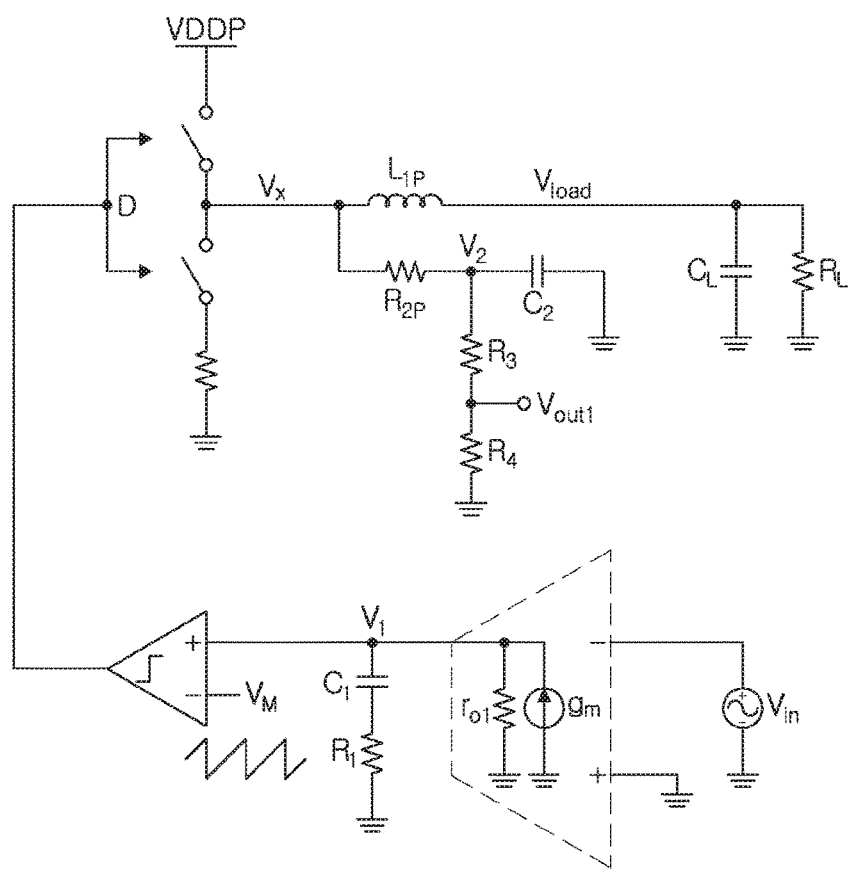
Figure 5D:
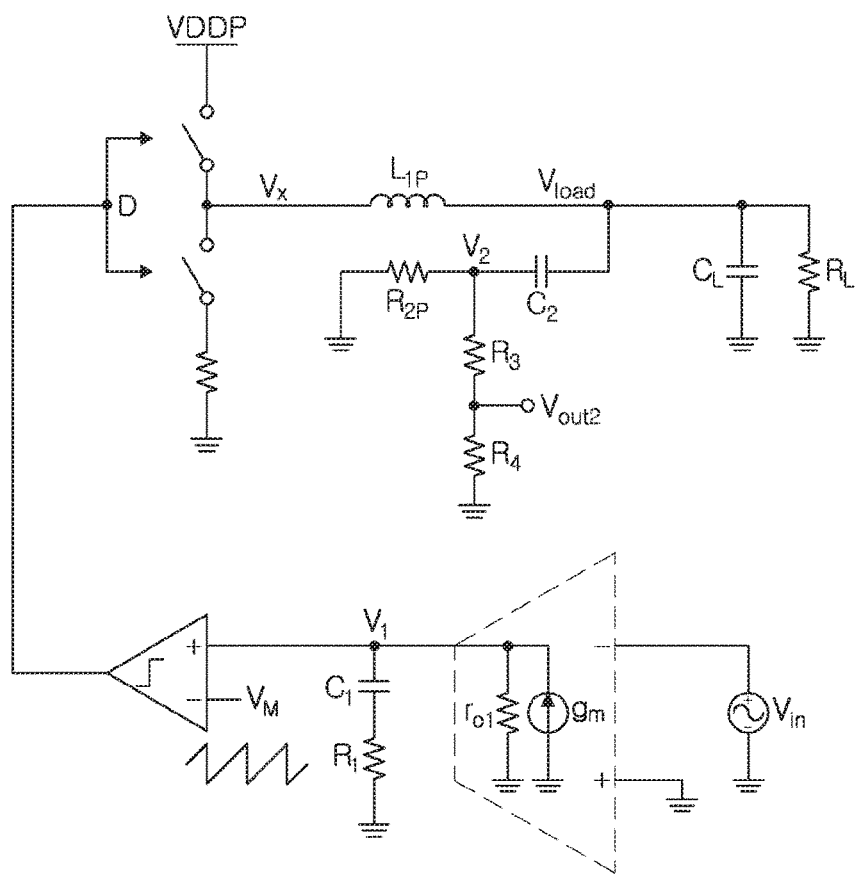

When analyzing the equivalent circuit diagram of FIG. 5B by a superposition method, the equivalent circuit diagram of FIG. 5B is illustrated as being divided, for example, as illustrated in FIGS. 5C and 5D. As a result, a loop gain T is divided into loop gains T① and T② to be calculated, and a detected signal Vout may also be divided into detected signals Vout1 and Vout2 (or Vout① and Vout②) in the following Equation).

The detected signal Vout, divided by the dividing resistors R3 and R4, is input to a negative (−) terminal of the first comparator and the envelope signal is input to a positive (+) terminal of the first comparator. However, in order to analyze the loop gain, the positive (+) terminal of the first comparator to which the envelope signal is input is connected to a ground, and the negative (−) terminal of the first comparator has an input signal Vin, which is arbitrarily set, input thereto.

The controller 230 compares the input signal Vin with the detected signal Vout and compares the comparison result with a reference signal $V_M$ to provide a control signal controlling a switching duty D of the converter 210.

When analyzing FIG. 5C, the following example Equation 1 is provided.

$$T① = \frac{v_1}{v_{in}} \cdot \frac{v_x}{v_1} \cdot \frac{v_2}{v_x} \cdot \frac{V_{out①}}{v_2} = \frac{V_{out①}}{v_{in}}$$

$$\frac{v_1}{v_{in}} = g_m \cdot \left\{ r_{o1} \cdot \left( R_1 + \frac{1}{sC_1} \right) \right\}$$

$$\frac{v_x}{v_1} = \frac{D \cdot VDDP}{V_M}$$

$$\frac{v_2}{v_x} = \frac{\frac{1}{sC_2}}{R_{2p} + \frac{1}{sC_2}} = \frac{1}{1 + sR_{2p}C_2}$$

$$\frac{V_{out①}}{v_2} = \frac{R_4}{R_3 + R_4 + R_{2p} \cdot \frac{1}{sC_2}}$$

$$T① = gm \cdot r_{o1} \cdot \frac{D \cdot VDDP}{V_M} \cdot \frac{R_4}{R_3 + R_4} \cdot \frac{1 + sR_1C_1}{1 + s(r_{o1} + R_1)C_1} \cdot \frac{1}{1 + sR_{2p}C_2}$$

Next, when analyzing FIG. 5D, the following example Equation 2 is provided.

$$T② = \frac{v_1}{v_{in}} \cdot \frac{v_x}{v_1} \cdot \frac{V_{load}}{v_x} \cdot \frac{V_{out②}}{V_{load}} = \frac{V_{out②}}{v_{in}}$$

$$\frac{v_1}{v_{in}} = g_m \cdot \left\{ r_{o1} \cdot \left( R_1 + \frac{1}{sC_1} \right) \right\}$$

$$\frac{v_x}{v_1} = \frac{D \cdot VDDP}{V_M}$$

-continued $$\frac{v_{load}}{v_x} = \frac{\left(R_L \cdot \frac{1}{sC_L}\right)}{sL_{1p} + \left(R_L \cdot \frac{1}{sC_L}\right)} = \frac{1}{1 + s\frac{L_{1p}}{R_L} + s^2 L_{1p} C_L}$$

$$\frac{v_{out} \; \textcircled{2}}{v_{load}} =$$

$$\frac{R_{2p}}{R_{2p} + \frac{1}{sC_2} + R_L \cdot L_{1p} \cdot \frac{1}{sC_L}} \cdot \frac{R_4}{R_3 + R_4 + \left\{R_{2p} \cdot \left(\frac{1}{sC_2} + R_L \cdot L_{1p} \cdot \frac{1}{sC_L}\right)\right\}}$$

$$T\textcircled{2} = gm \cdot ro1 \cdot \frac{D \cdot VDDP}{V_M} \cdot \frac{R_4}{R_3 + R_4} \cdot$$

$$\frac{1 + sR_1C_1}{1 + s(r_{o1} + R_1)C_1} \cdot \frac{1}{1 + s\frac{L_{1p}}{R_L} + s^2 L_{1p} C_L} \cdot \frac{sR_{2p}C_2}{1 + sR_{2p}C_2}$$

Results of the above-mentioned Equations 1 and 2 are respectively illustrated in FIGS. 6A and 6B.

When summing the results of the above-mentioned Equations 1 and 2, the following Equation 3 is obtained.

$$T = gm \cdot ro1 \cdot \frac{D \cdot VDDP}{V_M} \cdot \frac{R_4}{R_3 + R_4} \cdot \frac{1 + sR_1C_1}{1 + s(r_{o1} + R_1)C_1} \cdot$$

$$\left(\frac{1}{1 + sR_{2p}C_2} + \frac{1}{1 + s\frac{L_{1p}}{R_L} + s^2 L_{1p} C_L} \cdot \frac{sR_{2p}C_2}{1 + sR_{2p}C_2}\right)$$

The above-mentioned Equation 3 is illustrated in FIG. 6C, and it may be seen that the bandwidth of the signal is increased as in a solid line illustrated in FIG. 6C.

In Equation 3, gm is transconductance of a first comparator OTA (e.g., 130A1) of the comparison block, ro1 is output impedance of the first comparator OTA (e.g., 130A1) of the comparison block, VDDP is voltage level of input power, $V_M$ is magnitude of a reference signal (e.g., a triangular wave), R3 and R4 are feedback resistors, R1 and C1 are a resistor and a capacitor in the comparison block, R2, C2, and L1 are a detection resistor, a detection capacitor, and an inductor of the detector (e.g., 120), RL and CL are a load resistor and a load capacitor of a load (e.g., an RF power amplifier), s is a Laplacian constant, and T, T1, and T2 are loop gains.

Figure 7A:
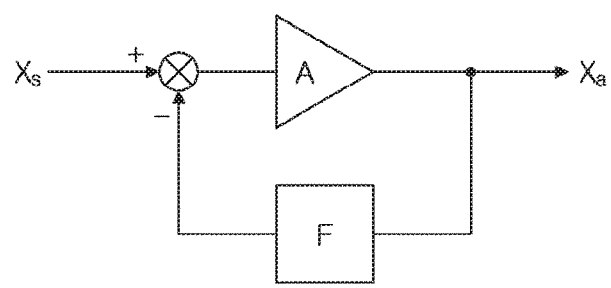
FIGS. 7A and 7B are diagrams illustrating a loop gain and an increase in a bandwidth of a signal in the power supply apparatus for a power amplifier according to an embodiment.
Figure 7B:
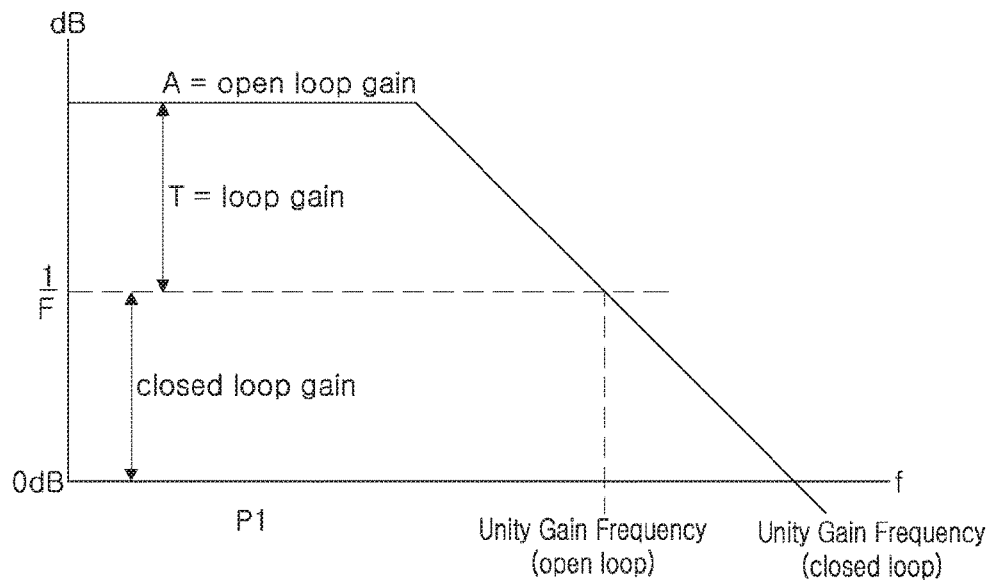

FIGS. 7A and 7B are diagrams illustrating a loop gain and an increase in a bandwidth of a signal in the power supply apparatus for a power amplifier, according to an embodiment.

Referring to FIG. 7A, the loop gain in a general feedback system is a product of an open loop gain A and a feedback factor F.

A loop gain Equation such as T (loop gain)=FA is provided. Referring to FIG. 7B, a bandwidth of the loop gain determines a frequency of 3 dB of a closed loop and a frequency of a unity gain of the closed loop.

Thus, in a case in which the bandwidth of the loop gain is increased, a bandwidth of the closed loop is increased, that is, a signal bandwidth in an entire feedback system is increased.

Figure 8A:
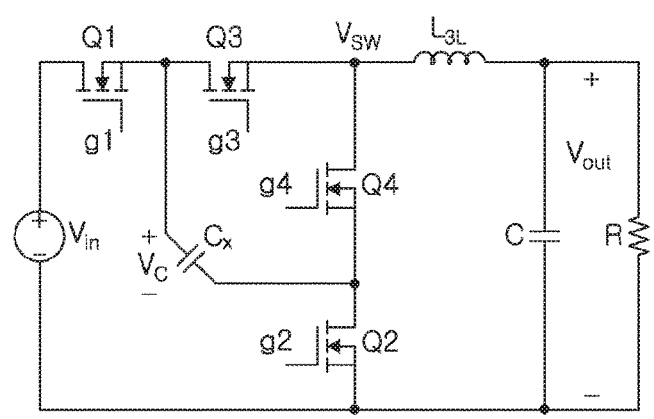
FIGS. 8A through 8C are equivalent circuit diagrams illustrating an operation of a power supply circuit of the power supply apparatus for a power amplifier according to an embodiment.
Figure 8B:
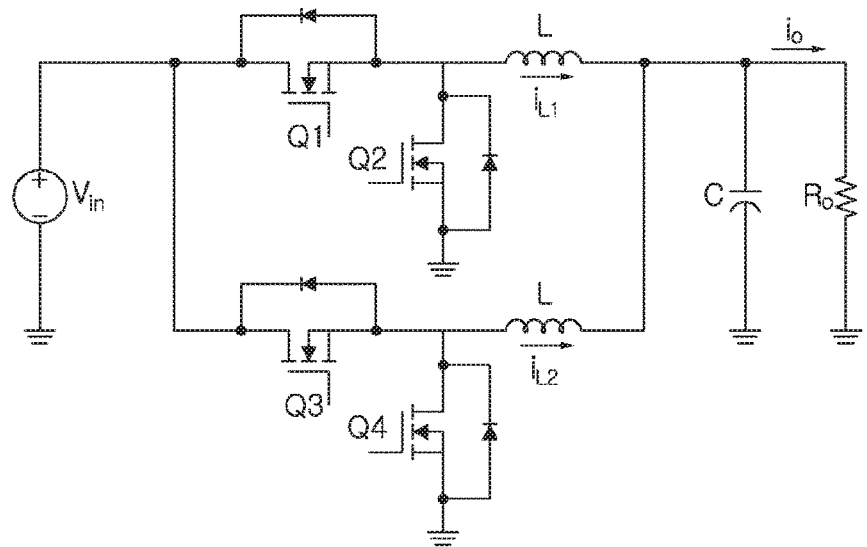
Figure 8C:
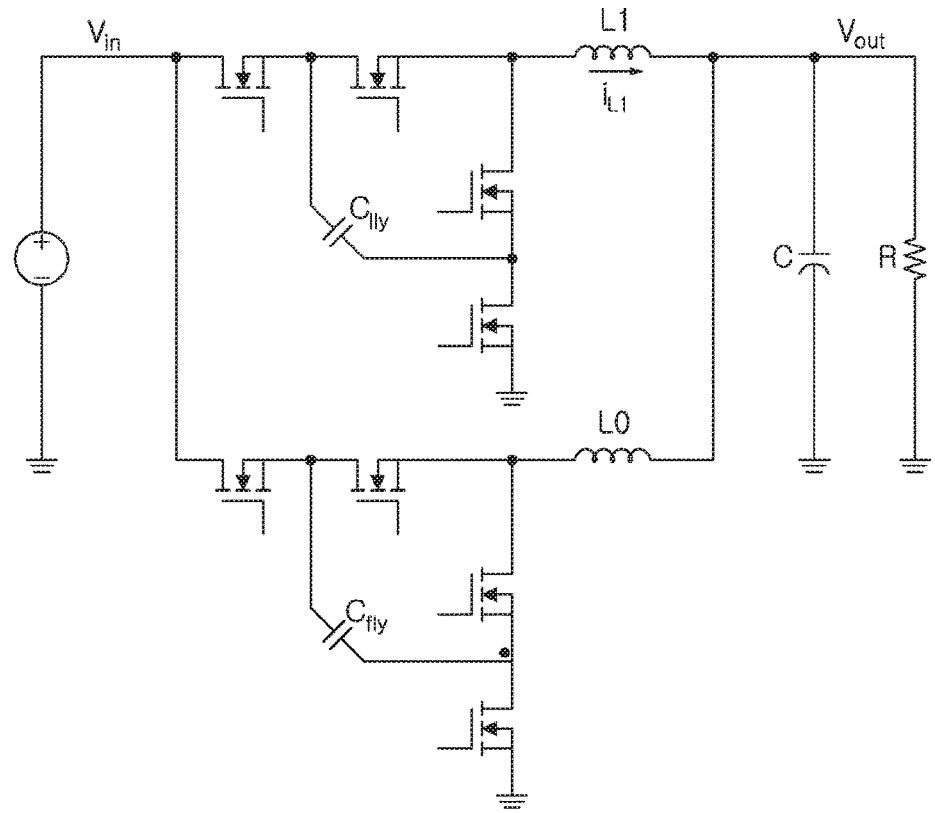

FIGS. 8A through 8C are equivalent circuit diagrams illustrating an operation of a power supply circuit of the power supply apparatus for a power amplifier according to an embodiment.

FIG. 8A is an equivalent circuit diagram of the converter 110 of the power supply apparatus 100 for a power amplifier, according to an embodiment illustrated in FIG. 2. FIG. 8B is an equivalent circuit diagram of the converter 210 of the power supply apparatus 200 of a power amplifier according to another embodiment illustrated in FIG. 3.

Referring to FIG. 8A, the converter 110 of the power supply apparatus 100 for a power amplifier according to an embodiment is operated as a three-level converter having four switches Q1, Q2, Q3, and Q4. As result, the switch has an effective switching frequency of about 100 MHz by an actual switching frequency of about 50 MHz, for example. In order to smoothly operate the switch, the reference signals provided to the controller have the phase difference of about 180°.

Referring to FIG. 8B, the outputs of the respective converters of the plurality of power modules are combined to be transferred to the power amplifier. Further, the converter of each of the power modules include two switches Q1 and Q2 or Q3 and Q4 to be operated as a two-level converter, but have a switching frequency which is reduced by half in preparation for a case in which one power module operated as the two-level converter supplies the driving power to the power amplifier, because the outputs of the respective converters of the plurality of power modules are combined to be transferred to the power amplifier.

FIG. 8C illustrates an equivalent circuit diagram of the converter of the power supply apparatus including a plurality of modules each having the converter operated as the three-level converter illustrated in FIG. 4. Even if the switch is operated at an actual switching frequency of about 25 MHz, for example, by coupling the power supply apparatuses of FIGS. 8A and 8B to each other, the switch may have an effective switching frequency of about 100 MHz.

As described above, according to the embodiments, the signal bandwidth is increased by the provided circuit structure. Further, the effective switching frequency is increased to be more responsive to the envelope signal, and a ripple voltage is be reduced.

The apparatuses, units, modules, devices, controllers and other components (e.g., power modules 110, 210, 220, controllers 130, 230, 231, gate signal controller 111) that perform the operations described herein are implemented by hardware components. Examples of hardware components include processors, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described herein may be performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply apparatus, comprising:
   a converter configured to convert input power into driving power;
   a detector configured to transfer the driving power from the converter to a power amplifier, and comprising an inductor formed on a detection path of the driving power, and configured to detect power information of the driving power to generate a detected signal; and
   a controller comprising a first comparison block and a second comparison block,
   wherein the controller is configured to control power conversion of the converter based on operations performed by the first comparison block on a reference signal input to the first comparison block, an envelope signal of a signal input to the power amplifier, and the detected signal, and operations performed by the second comparison block on the reference signal input to the second comparison block, the envelope signal, and the detected signal, and
   wherein a phase of the reference signal in the operations performed by the second comparison block is different than a phase of the reference signal in the operations performed by the first comparison block.

2. The power supply apparatus of claim 1, wherein the detector comprises:
   a first detection path configured to detect voltage information of the driving power through a resistor connected to an input terminal of the inductor; and
   a second detection path configured to detect current information of the inductor through a capacitor connected to an output terminal of the inductor.

3. The power supply apparatus of claim 2, wherein the detector is configured to divide a first signal through the first detection path and a second signal through the second detection path, and feed back the divided detected signal to the controller.

4. The power supply apparatus of claim 1, wherein
   a first comparator of the first comparison block and the second comparison block are configured to compare the detected signal with the envelope signal; and
   a second comparator of the first comparison block and the second comparison block are configured to compare a comparison result of the first comparator with the reference signal to provide a control signal to the converter.

5. The power supply apparatus of claim 1, wherein the converter comprises a multi-level converter.

6. The power supply apparatus of claim 5, wherein the converter comprises a three-level converter.

7. The power supply apparatus of claim 1, wherein a difference between the phase of the reference signal in the first comparison block and the phase of the reference signal in the second comparison block is about 180°.

8. The power supply apparatus of claim 1, wherein a difference between the phase of the reference signal in the first comparison block and the phase of the reference signal in the second comparison block is about 90°.

9. The power supply apparatus of claim 1, wherein a difference between the phase of the reference signal in the first comparison block and the phase of the reference signal in the second comparison block is about 270°.

10. A power supply apparatus, comprising:
a converter configured to convert input power into driving power;
a detector configured to transfer the driving power from the converter to a power amplifier, and comprising an inductor formed on a detection path of the driving power, and configured to detect power information of the driving power to generate a detected signal; and
a controller configured to control power conversion of the converter based on an envelope signal of a signal input to the power amplifier and the detected signal, and comprising:
  a first comparison block configured to compare the envelope signal with the detected signal and compare a comparison result with a reference signal to provide a first control signal controlling power conversion of the converter; and
  a second comparison block configured to compare the envelope signal with the detected signal and compare a comparison result with a signal obtained by phase-shifting the reference signal by 180° to provide a second control signal controlling the power conversion of the converter.

11. A power supply apparatus, comprising:
power modules configured to supply driving power,
wherein each of the power modules comprises:
  a converter configured to convert input power into driving power;
  a detector configured to transfer the driving power from the converter to a power amplifier, and comprising an inductor formed on a detection path of the driving power, and configured to detect information of the driving power to generate a detected signal; and
  a controller comprising a first comparison block and a second comparator block,
wherein the controller is configured to control power conversion of the converter based on operations performed by the first comparison block on a reference signal input to the first comparison block, an envelope signal of a signal input to the power amplifier, and the detected signal, and operations performed by the second comparison block on the reference signal input to the second comparison block, the envelope signal, and the detected signal, and
wherein a phase of the reference signal in the operations performed by the second comparison block is different than a phase of the reference signal in the operations performed by the first comparison block.

12. The power supply apparatus of claim 11, wherein the detector comprises:
a first detection path configured to detect voltage information of the driving power through a resistor connected to an input terminal of the inductor; and
a second detection path configured to detect current information of the inductor through a capacitor connected to an output terminal of the inductor and commonly connected to the power modules.

13. The power supply apparatus of claim 12, wherein the detector is further configured to divide a first signal through the first detection path and a second signal through the second detection path, and feed back the divided detected signal to the controller.

14. The power supply apparatus of claim 11, wherein
a first comparator of the first comparison block and the second comparison block are configured to compare the detected signal with the envelope signal, and
a second comparator of the first comparison block and the second comparison block are configured to compare a comparison result of the first comparator with the reference signal to provide a control signal to the converter.

15. The power supply apparatus of claim 11, wherein the converter comprises a multi-level converter.

16. The power supply apparatus of claim 15, wherein the converter comprises a three-level converter.

17. The power supply apparatus of claim 16, wherein the first comparison block is configured to compare the envelope signal with the detected signal and compare a comparison result thereof with the reference signal to provide a first control signal controlling power conversion of the converter; and
the second comparison block is configured to compare the envelope signal with the detected signal and compare a comparison result thereof with the reference signal, which is phase-shifted by 180°, to provide a second control signal controlling the power conversion of the converter,
wherein a phase of the reference signal input to the controller of each of the power modules and a phase of the signal obtained by phase-shifting the reference signal are different from each other.

* * * * *